United States Patent
Kuno et al.

(10) Patent No.: US 12,087,609 B2
(45) Date of Patent: Sep. 10, 2024

(54) WAFER PLACEMENT TABLE

(71) Applicant: NGK Insulators, Ltd., Nagoya (JP)

(72) Inventors: Tatsuya Kuno, Nagoya (JP); Takumi Wakisaka, Takahama (JP)

(73) Assignee: NGK INSULATORS, LTD., Nagoya (JP)

( * ) Notice: Subject to any disclaimer, the term of this patent is extended or adjusted under 35 U.S.C. 154(b) by 271 days.

(21) Appl. No.: 17/804,617

(22) Filed: May 31, 2022

(65) Prior Publication Data
US 2022/0399223 A1    Dec. 15, 2022

(30) Foreign Application Priority Data
Jun. 10, 2021    (JP) ................................ 2021-097249

(51) Int. Cl.
*H01L 21/683*    (2006.01)
*H01L 21/67*    (2006.01)
*H01L 21/687*    (2006.01)

(52) U.S. Cl.
CPC .... *H01L 21/6833* (2013.01); *H01L 21/67248* (2013.01); *H01L 21/68757* (2013.01); *H01L 21/68785* (2013.01); *H01L 21/6831* (2013.01)

(58) Field of Classification Search
CPC ......... H01L 21/68785; H01L 21/68757; H01L 21/67248; H01L 21/6833; H01L 21/67103; H01L 21/68742
USPC ........................................................ 361/234
See application file for complete search history.

(56) References Cited

U.S. PATENT DOCUMENTS

| | | | |
|---|---|---|---|
| 6,215,643 B1 * | 4/2001 | Nagasaki | H01L 21/6833 279/128 |
| 2006/0073349 A1 | 4/2006 | Aihara et al. | |
| 2007/0042897 A1 | 2/2007 | Aihara et al. | |
| 2011/0063771 A1 * | 3/2011 | Nishioka | H01L 21/6833 361/234 |

(Continued)

FOREIGN PATENT DOCUMENTS

| | | | |
|---|---|---|---|
| JP | 2000-077508 A | | 3/2000 |
| JP | 2002110773 A | * | 4/2002 |
| JP | 3323135 B2 | | 9/2002 |

(Continued)

OTHER PUBLICATIONS

Machine translation of Inoue Japanese Patent Document JP 2002-110773 A Apr. 2002 (Year: 2002).*

(Continued)

*Primary Examiner* — Kevin J Comber
(74) *Attorney, Agent, or Firm* — BURR PATENT LAW, PLLC

(57) ABSTRACT

A wafer placement table includes a ceramic substrate that has a wafer placement surface, a first electrode that is embedded in the ceramic substrate, a first power supply terminal that is inserted from a surface of the ceramic substrate opposite the wafer placement surface toward the first electrode, a first joint that joins the first electrode and the first power supply terminal to each other and a second electrode that is disposed between the wafer placement surface and the first electrode in the ceramic substrate. A linear portion that extends in the ceramic substrate from a position on the first electrode opposite the first joint to the wafer placement surface is composed of material of the ceramic substrate.

4 Claims, 4 Drawing Sheets

(56) References Cited

U.S. PATENT DOCUMENTS

2018/0374640 A1   12/2018   Akiyoshi
2021/0225669 A1    7/2021   Aikawa et al.

FOREIGN PATENT DOCUMENTS

| JP | 2003-077995 A | 3/2003 |
| JP | 2006-128603 A | 5/2006 |
| JP | 2007-051045 A | 3/2007 |
| JP | 2011-086919 A | 4/2011 |
| JP | 2017-135350 A | 8/2017 |
| JP | 6843320 B1 | 3/2021 |

OTHER PUBLICATIONS

Japanese Office Action (with English translation) dated Jan. 9, 2024 (Application No. 2021-097249).
Taiwanese Office Action (Application No. 111120621) dated Dec. 18, 2023 (7 pages)
Japanese Notification of Third Party Submission (Application No. 2021-097249) dated Oct. 10, 2023 (with partial English translation) (4 pages).
Korean Office Action (with English translation) dated Feb. 19, 2024 (Application No. 10-2022-0066198).
Korean Third Party Submission dated May 29, 2024 (Application No. 10-2022-0066198).

\* cited by examiner

WAFER PLACEMENT TABLE

BACKGROUND OF THE INVENTION

1. Field of the Invention

The present invention relates to a wafer placement table.

2. Description of the Related Art

A wafer placement table is known as a member for a semiconductor manufacturing apparatus. For example, a wafer placement table disclosed in PTL 1 includes a ceramic substrate that has a wafer placement surface, a heater electrode that is embedded in the ceramic substrate, and an electrostatic electrode that is embedded in the ceramic substrate between the wafer placement surface and the heater electrode and that covers the heater electrode. A heater power supply terminal that supplies power to the heater electrode is inserted from a surface of the ceramic substrate opposite the wafer placement surface toward the heater electrode and is electrically joined to the heater electrode.

CITATION LIST

Patent Literature

PTL 1: JP 2011-086919 A

SUMMARY OF THE INVENTION

In such a wafer placement table, a cavity is formed in a joint between the heater electrode and the heater power supply terminal in some cases. In these cases, the resistance of the joint increases. Accordingly, the temperatures of the joint and the vicinity thereof increase when power is supplied to the heater electrode via the heater power supply terminal, and the thermal uniformity of a wafer decreases. For this reason, there is a need to inspect the joint from the wafer placement surface by using an ultrasonic flaw detector without destroying the wafer placement table. However, the joint between the heater electrode and the heater power supply terminal is covered by the electrostatic electrode. For this reason, there is a problem in that ultrasonic rays that are emitted from the ultrasonic flaw detector are blocked by the electrostatic electrode, and the joint cannot be detected. The problem is not limited to the joint between the heater electrode and the heater power supply terminal but occurs for a joint between an electrode that is embedded in the ceramic substrate and a power supply terminal that is connected to the electrode.

The present invention has been accomplished to solve the problem, and it is a main object of the present invention to inspect a first joint between a first electrode that is embedded in a ceramic substrate of a wafer placement table and a first power supply terminal that supplies power to the first electrode in a non-destructive manner.

A wafer placement table according to the present invention includes a ceramic substrate that has a wafer placement surface, a first electrode that is embedded in the ceramic substrate, a first power supply terminal that is inserted from a surface of the ceramic substrate opposite the wafer placement surface toward the first electrode, a first joint that joins the first electrode and the first power supply terminal to each other, and a second electrode that is disposed between the wafer placement surface and the first electrode in the ceramic substrate. A linear portion that extends in the ceramic substrate from a position on the first electrode opposite the first joint to the wafer placement surface is composed of material of the ceramic substrate.

As for the wafer placement table, the linear portion that extends in the ceramic substrate from the position on the first electrode opposite the first joint to the wafer placement surface is composed of the material of the ceramic substrate. That is, the linear portion does not contain, for example, metal. For this reason, in the case where the first joint is inspected from the wafer placement surface in a non-destructive manner by using an ultrasonic flaw detector, an ultrasonic ray that enters the linear portion from the wafer placement surface is not blocked by, for example, metal until the ultrasonic ray reaches a position on the first electrode opposite the first joint, and subsequently, the reflected ultrasonic ray is not blocked but returns to the wafer placement surface. Accordingly, the first joint can be inspected in a non-destructive manner.

As for wafer placement table according to the present invention, the second electrode may have a through-hole at a position at which the first joint is projected on the second electrode in a vertical direction, and an inner portion of the through-hole may be filled with the material of the ceramic substrate and forms a part of the linear portion. This enables the first joint to be inspected in a non-destructive manner even when the second electrode that covers the first electrode is disposed between the wafer placement surface and the first electrode in the ceramic substrate.

The first joint preferably has a circular shape that has a diameter d, and the through-hole is preferably a round hole and preferably has a diameter of no less than d/2 and no more than 2d. When the diameter of the through-hole is d/2 or more, the ultrasonic ray can be reflected and return to the wafer placement surface with certainty after the ultrasonic ray reaches the position on the first electrode opposite the first joint from the wafer placement surface. When the diameter of the through-hole is 2d or less, the function of the second electrode can be successfully maintained.

As for the wafer placement table according to the present invention, the second electrode may be disposed so as to avoid the linear portion. This enables the first joint to be inspected in a non-destructive manner even when the second electrode is disposed between the wafer placement surface and the first electrode in the ceramic substrate.

As for the wafer placement table according to the present invention, the first electrode may be a heater electrode or a RF electrode. When the first electrode is the heater electrode, the second electrode may be an electrostatic electrode, a RF electrode, or a heater electrode that differs from the first electrode. When the first electrode is the RF electrode, the second electrode may be an electrostatic electrode, a heater electrode, or a RF electrode that differs from the first electrode. For example, when the second electrode is a unipolar electrostatic electrode or RF electrode, the through-hole is preferably formed at the position at which the first joint is projected on the second electrode in the vertical direction, and the through-hole is preferably filled with the material of the ceramic substrate. When the second electrode is a bipolar electrostatic electrode or heater electrode, the second electrode is preferably disposed so as to avoid the linear portion.

As for the wafer placement table according to the present invention, the first electrode may be a heater electrode that is formed by using a resistance heating element, and the resistance heating element preferably has a two-dimensional shape (such as an elongated flat ribbon shape) and has a thickness of no less than 1 μm and no more than 100 μm. This increases the accuracy of the inspection of the first joint between the first electrode (the resistance heating element) and the first power supply terminal from the wafer placement surface in a non-destructive manner.

DETAILED DESCRIPTION OF THE INVENTION

Figure 1:
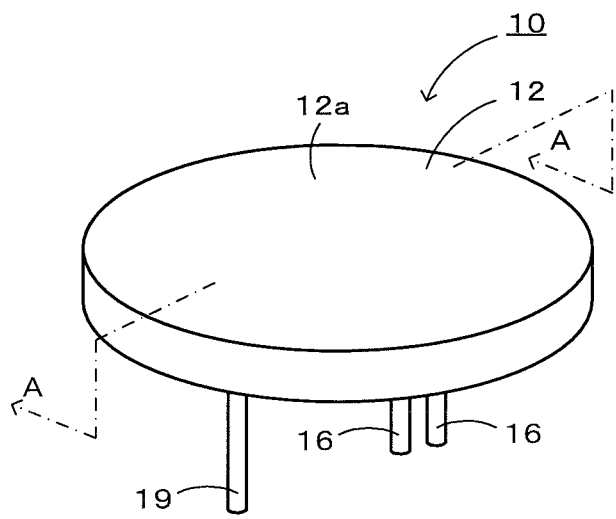
FIG. 1 is a perspective view of an electrostatic chuck heater 10.
Figure 2:
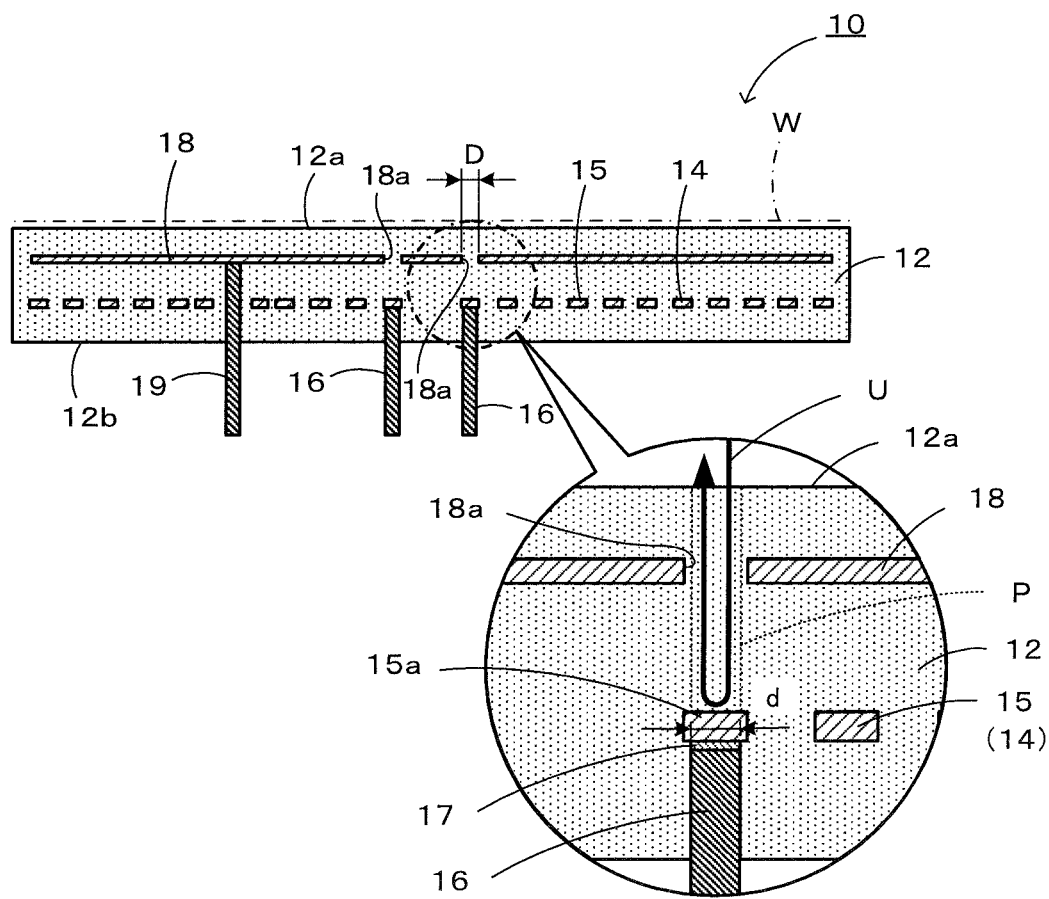
FIG. 2 is a sectional view of FIG. 1 taken along line A-A.
Figure 3:
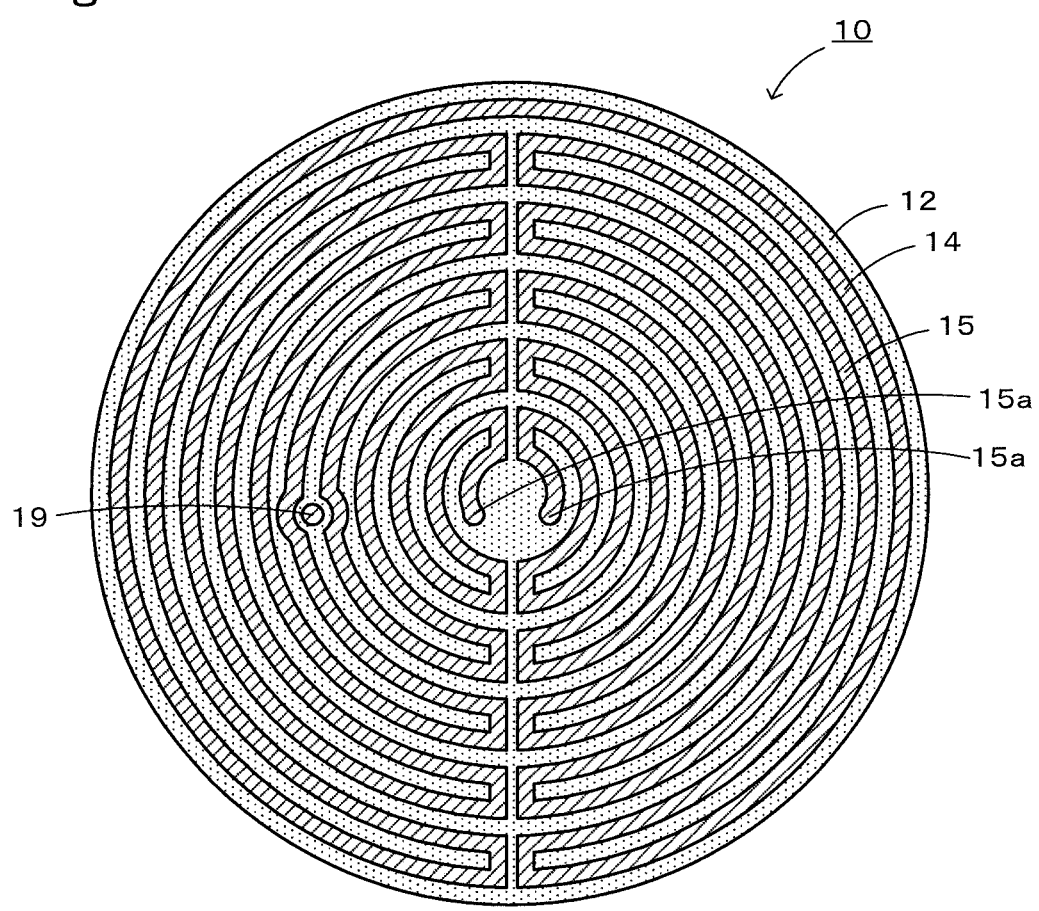
FIG. 3 is a sectional view of the electrostatic chuck heater 10 viewed from above and taken along a heater electrode 14 in the horizontal direction.
Figure 4:
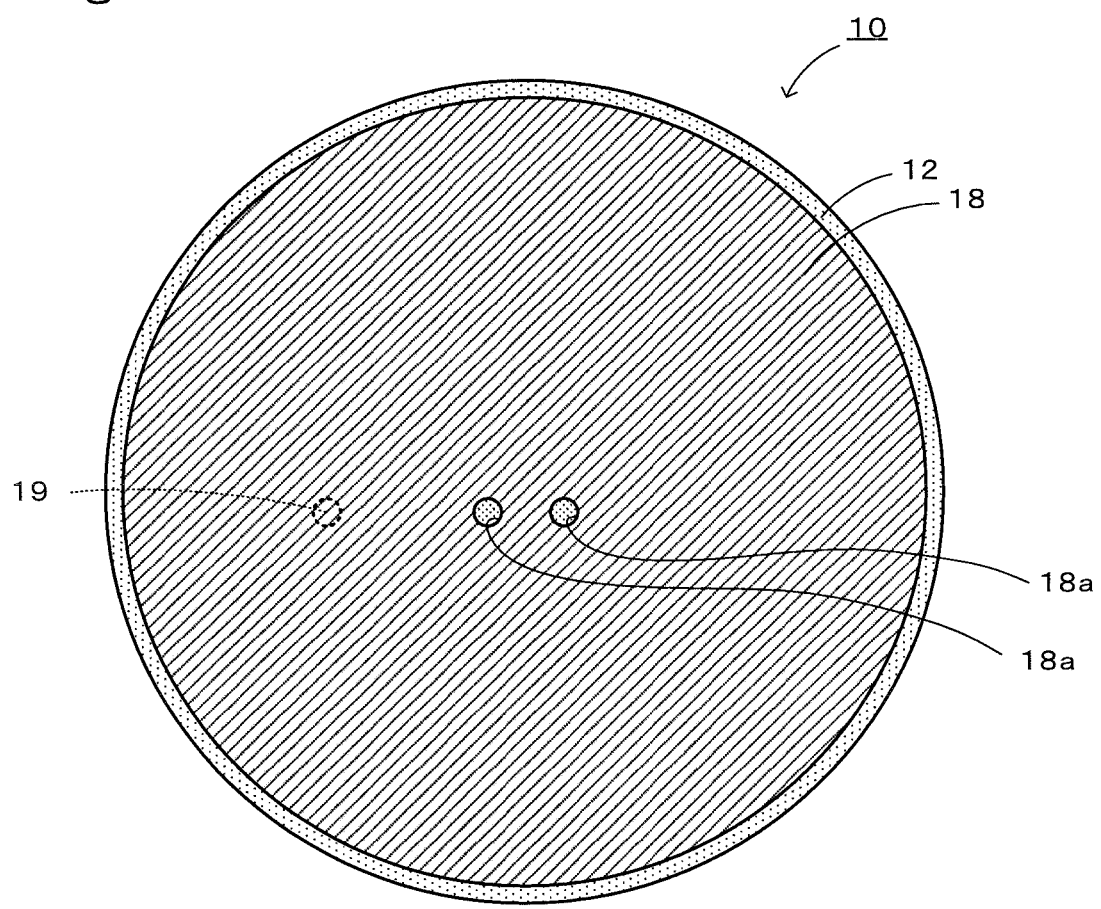
FIG. 4 is a sectional view of the electrostatic chuck heater 10 viewed from above and taken along an electrostatic electrode 18 in the horizontal direction.

An embodiment of the present invention will be described with reference to the drawings. FIG. 1 is a perspective view of an electrostatic chuck heater 10 according to the present embodiment. FIG. 2 is a sectional view of FIG. 1 taken along line A-A. FIG. 3 is a sectional view of the electrostatic chuck heater 10 viewed from above and taken along a heater electrode 14 in the horizontal direction. FIG. 4 is a sectional view of the electrostatic chuck heater 10 viewed from above and taken along an electrostatic electrode 18 in the horizontal direction. In FIG. 2, an enlarged partial view of a circle of a one-dot chain line is also illustrated. In some cases, the words "up-down", "left-right", and "front-rear" are used in the following description. However, these merely represent relative positional relationships. The word "to" representing a numerical range in the present specification has meaning including the lower limit and upper limit of a numeral described in front or rear of that.

The electrostatic chuck heater 10 is a wafer placement table that includes the heater electrode 14 and the electrostatic electrode 18 that are embedded in a ceramic substrate 12.

The ceramic substrate 12 is a ceramic (such as alumina or aluminum nitride) disk. Surfaces of the ceramic substrate 12 include a wafer placement surface 12a on which a wafer W can be placed.

The heater electrode 14 is formed by using a resistance heating element 15 that is formed on a plane parallel with the wafer placement surface 12a and that has a belt-like shape (an elongated flat ribbon shape). The word "parallel" includes not only a case of being completely parallel but also a case of being substantially parallel (for example, a case of being within tolerance). For example, the resistance heating element 15 that has a belt-like shape may have, but is not particularly limited to, a width of 0.1 to 10 mm, a thickness of 1 to 100 μm, and a line distance of 0.1 to 5 mm. The heater electrode 14 extends in a one-stroke pattern from one of two end portions 15a of the resistance heating element 15 to the other so as not to intersect over the entire ceramic substrate 12. For example, the heater electrode 14 can be formed by applying conductive paste. Heater power supply terminals 16 that have a column shape are joined to the end portions 15a of the resistance heating element 15 by using joints 17. That is, the joints 17 join the heater electrode 14 and the heater power supply terminals 16 to each other. The diameters of the heater power supply terminals 16 are not particularly limited but are preferably 1 to 10 mm, more preferably 3 to 7 mm. The diameters of the joints 17 are roughly equal to the diameters of the heater power supply terminals 16. The heater power supply terminals 16 are inserted in terminal holes that extend from a surface 12b of the ceramic substrate 12 opposite the wafer placement surface 12a to the lower surfaces of the end portions 15a of the resistance heating element 15. The joints 17 are circular members composed of, for example, a brazing metal material and have diameters equal to those of the heater power supply terminals 16. A heater power supply, not illustrated, is connected to a pair of the heater power supply terminals 16. Examples of the material of the resistance heating element 15 include tungsten carbide, metal tungsten, molybdenum carbide, and metal molybdenum. Among these, one having a thermal expansion coefficient close to that of ceramics that is used for the ceramic substrate 12 is preferably selected. The ceramics that is used for the ceramic substrate 12 may be added. Examples of the material of the heater power supply terminals 16 include metal tungsten, metal molybdenum, metal nickel, and nickel alloys.

The electrostatic electrode 18 is a conductive thin film that is parallel with the wafer placement surface 12a and that has a circular shape. The electrostatic electrode 18 is disposed between the wafer placement surface 12a and the heater electrode 14. A rod-like terminal 19 that has a column shape is electrically connected to the electrostatic electrode 18 by using a brazing material. The rod-like terminal 19 is inserted in a terminal hole that extends from the surface 12b of the ceramic substrate 12 opposite the wafer placement surface 12a to the lower surface of the electrostatic electrode 18. The rod-like terminal 19 is located insulation distance away from the heater electrode 14 so as to prevent a short circuit with the heater electrode 14. A direct current power supply, not illustrated, is connected to the rod-like terminal 19. A portion of the ceramic substrate 12 between the electrostatic electrode 18 and the wafer placement surface 12a functions as a dielectric layer. Examples of the material of the electrostatic electrode 18 include tungsten carbide, metal tungsten, molybdenum carbide, and metal molybdenum. Among these, one having a thermal expansion coefficient close to that of the ceramics that is used for the ceramic substrate 12 is preferably selected. The ceramics that is used for the ceramic substrate 12 may be added. Examples of the material of the rod-like terminal 19 include metal tungsten, metal molybdenum, metal nickel, and nickel alloy.

The electrostatic electrode 18 has through-holes 18a at positions at which the joints 17 are projected on the electrostatic electrode 18 upward in the vertical direction. Inner portions of the through-holes 18a are filled with the same material as that of the ceramic substrate 12. As a result, linear portions P (see the enlarged partial view in FIG. 2) that extend in the ceramic substrate 12 from positions (the upper surfaces of the end portions 15a of the resistance heating element 15) on the heater electrode 14 opposite the joints 17 to the wafer placement surface 12a are composed of the material of the ceramic substrate 12. The inner portions of the through-holes 18a form parts of the linear portions P. The through-holes 18a are preferably round holes and preferably have a diameter D of no less than d/2 and no more than 2d (d is the diameter of each joint 17). Alternatively, the diameters of the through-holes 18a may have a value obtained by adding 0 to 5 mm to the diameters of the heater power supply terminals 16 (unit: mm).

An example of the use of the electrostatic chuck heater 10 will now be described. The wafer W is placed on the wafer placement surface 12a of the electrostatic chuck heater 10. The voltage of the direct current power supply, not illustrated, is applied between the electrostatic electrode 18 and the wafer W, and the wafer W is attracted to the wafer placement surface 12a by using electrostatic force. In this state, a plasma CVD film is formed on the wafer W, or the wafer W is etched by plasma etching. The voltage of the heater power supply, not illustrated, is applied to both end portions 15a of the resistance heating element 15, the wafer W is heated, and the temperature of the wafer W is consequently kept constant.

The inspection of each joint 17 of the electrostatic chuck heater 10 by using an ultrasonic flaw detector will now be described. A probe of the ultrasonic flaw detector is disposed at a position on the wafer placement surface 12a right above the joint 17, a time until an ultrasonic ray U (see the enlarged partial view in FIG. 2) that is emitted from the probe toward the joint 17 is reflected and returns to the probe and the intensity of the ultrasonic ray that returns are measured, and whether a cavity is formed in the joint 17 is evaluated.

Here, correspondence relationships between components according to the present embodiment and components according to the present invention are clarified. The electrostatic chuck heater 10 according to the present embodiment corresponds to a wafer placement table according to the present invention. The heater electrode 14 corresponds to a first electrode. Each heater power supply terminal 16 corresponds to a first power supply terminal. Each joint 17 corresponds to a first joint. The electrostatic electrode 18 corresponds to a second electrode. Each linear portion P corresponds to a linear portion.

As for the electrostatic chuck heater 10 according to the present embodiment described above, the linear portions P that extend in the ceramic substrate 12 from the positions on the heater electrode 14 opposite the joints 17 to the wafer placement surface 12a are composed of the material of the ceramic substrate 12. That is, the linear portions P do not contain, for example, metal. For this reason, in the case where the joints 17 are inspected from the wafer placement surface 12a in a non-destructive manner by using the ultrasonic flaw detector, ultrasonic rays that enter the linear portions P from the wafer placement surface 12a are not blocked by, for example, metal until the ultrasonic rays reach the end portions 15a of the resistance heating element 15 that are joined to the heater power supply terminals 16, and subsequently, the reflected ultrasonic rays are not blocked but return to the wafer placement surface 12a. Accordingly, the joints 17 between the heater electrode 14 and the heater power supply terminals 16 can be inspected in a non-destructive manner.

The electrostatic electrode 18 has the through-holes 18a at the positions at which the joints 17 between the heater electrode 14 and the heater power supply terminals 16 are projected on the electrostatic electrode 18 in the vertical direction. The inner portions of the through-holes 18a are filled with the material of the ceramic substrate 12 and form parts of the linear portions P. For this reason, even when the heater electrode 14 is covered by the electrostatic electrode 18, the joints 17 can be inspected in a non-destructive manner.

Each joint 17 preferably has a circular shape that has the diameter d. Each through-hole 18a is preferably a round hole and preferably has a diameter D of no less than d/2 and no more than 2d. The diameter D is preferably no less than d and no more than 2d. When the diameter D of the through-hole 18a is d/2 or more, the ultrasonic ray can be reflected and return to the wafer placement surface 12a with certainty after the ultrasonic ray reaches the end portion 15a of the resistance heating element 15 from the wafer placement surface 12a. When the diameter D of the through-hole 18a is 2d or less, the function of the electrostatic electrode 18 can be successfully maintained.

The thickness of the resistance heating element 15 is preferably no less than 1 μm and no more than 100 μm. This increases the accuracy of the inspection of the joints 17 from the wafer placement surface 12a in a non-destructive manner.

It goes without saying that the present invention is not limited to the embodiment described above, and various embodiments can be carried out within the technical range of the present invention.

Figure 5:
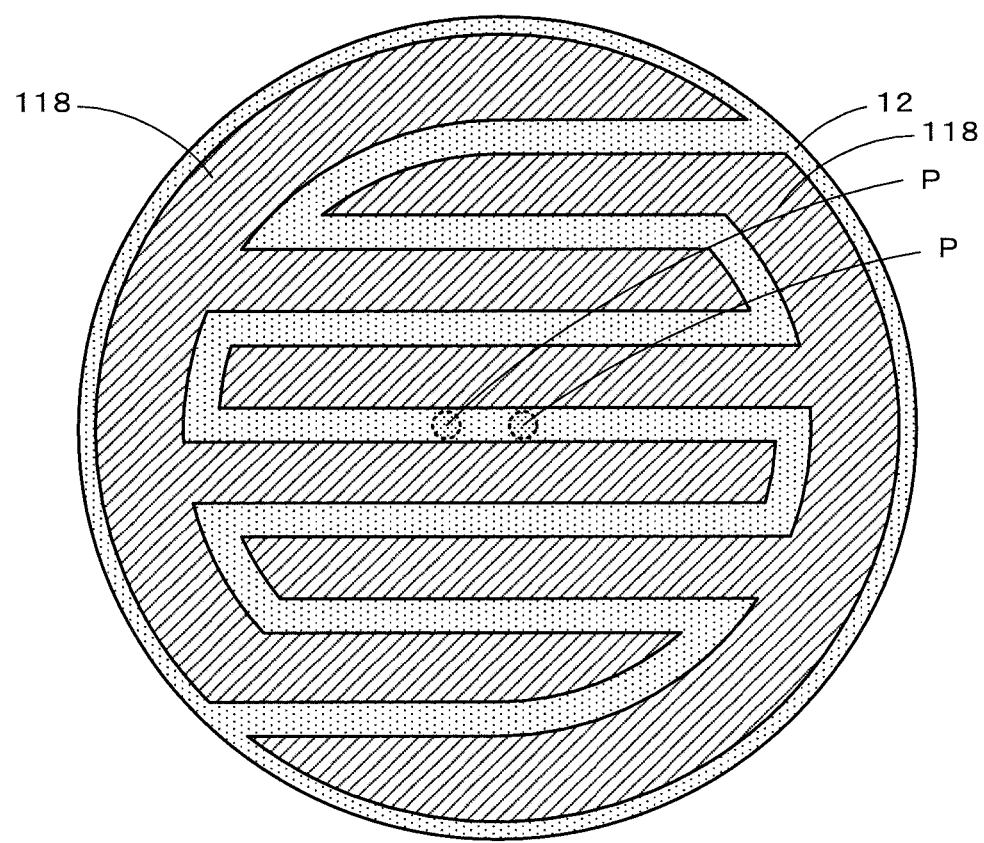
FIG. 5 is a sectional view of interdigital electrodes 118.

According to the embodiment described above, a unipolar electrostatic chuck that includes the single electrostatic electrode 18 is described above by way of example. As illustrated in FIG. 5, however, a bipolar electrostatic chuck that includes a pair of interdigital electrodes 118 may be used. In this case, the wafer W can be attracted to the wafer placement surface 12a by applying a predetermined voltage to the pair of the interdigital electrodes 118. In FIG. 5, the interdigital electrodes 118 have no through-holes, and each linear portion P is located in a gap between the interdigital electrodes 118. In other words, the pair of the interdigital electrodes 118 each corresponding to the second electrode is disposed so as to avoid the linear portion P. Consequently, the linear portion P is composed of the material of the ceramic substrate 12. Also, in this way, whether a cavity is formed in each joint 17 can be evaluated with the probe of the ultrasonic flaw detector disposed at a position on the wafer placement surface 12a right above the linear portion P. The position right above the linear portion P may include positions on surfaces of the interdigital electrodes 118, and through-holes that are the same as the through-holes 18a according to the embodiment described above may be formed at these positions, and inner portions of the through-holes may be filled with the same material as that of the ceramic substrate 12, instead of locating the position right above the linear portion P in the gap between the interdigital electrodes 118.

According to the embodiment described above, the wafer W is attracted to the wafer placement surface 12a by applying a direct current voltage to the electrostatic electrode 18. However, the electrostatic electrode 18 may double as a RF electrode (a radio frequency electrode) for producing plasma. Alternatively, the electrostatic electrode 18 is not used for electrostatic attraction of the wafer W but may be used as a RF electrode.

According to the embodiment described above, the heater electrode 14 that has a single layer is disposed in the ceramic substrate 12. However, another heater electrode may be disposed in a layer (for example, between the electrostatic electrode 18 and the heater electrode 14) that differs from the layer of the heater electrode 14. In this case, the linear portions P extend between lines of a resistance heating element that forms the other heater electrode.

As for the electrostatic chuck heater 10 according to the embodiment described above, a cooling plate may be mounted on the lower surface of the ceramic substrate 12. The cooling plate is preferably a metal (such as aluminum or aluminum alloy) disk that has a refrigerant passage through which refrigerant (such as water) can pass. The cooling plate has through-holes through which the heater power supply terminals 16 and the rod-like terminal 19 extend. In this case, the heater power supply terminals 16 and the rod-like terminal 19 are electrically insulated from the cooling plate.

The electrostatic chuck heater 10 according to the embodiment described above may have a gas hole or lift pin holes that extend through the ceramic substrate 12 in an up-down direction. The lift pin holes are holes through which lift pins extend. The lift pins lift the wafer W that is placed on the wafer placement surface 12a and place the lifted wafer W on the wafer placement surface 12a. The gas hole is a hole for supplying gas (such as He gas) toward the wafer W that is placed on the wafer placement surface 12a. Many circular projections may be formed on the wafer placement surface 12a, and the wafer W may be supported on the circular projections. In this case, an annular projection that has the same height as those of the circular projections may be formed as a seal band along the outer edge of the wafer placement surface 12a.

According to the embodiment described above, the heater electrode 14 is used as the first electrode according to the present invention, and the electrostatic electrode 18 is used as the second electrode, but this is not a limitation. For example, a RF electrode may be used as the first electrode according to the present invention, and an electrostatic electrode, a heater electrode, or a RF electrode may be used as the second electrode. In the case where RF electrodes are used as the first electrode and the second electrode, the RF electrodes are formed in two layers (multilayer). However, the RF electrodes may be connected to each other by using a through-hole conductor that extends in the up-down direction so as to have the same potential. The RF electrode that serves as the first electrode may have an annular shape, and the RF electrode that serves as the second electrode may have a disk shape.

The present application claims priority from Japanese Patent Application No. 2021-097249, filed on Jun. 10, 2021, the entire contents of which are incorporated herein by reference.

What is claimed is:

1. A wafer placement table comprising:
   a ceramic substrate that has a wafer placement surface;
   a first electrode that is embedded in the ceramic substrate;
   a first power supply terminal that is inserted from a surface of the ceramic substrate opposite the wafer placement surface toward the first electrode;
   a first joint that joins the first electrode and the first power supply terminal to each other; and
   a second electrode that is disposed between the wafer placement surface and the first electrode in the ceramic substrate,
   wherein a linear portion that extends in the ceramic substrate from a position on the first electrode opposite the first joint to the wafer placement surface is composed of material of the ceramic substrate, and
   wherein the second electrode has a through-hole at a position at which the first joint is projected on the second electrode in a vertical direction, and an inner portion of the through-hole is filled with the material of the ceramic substrate and forms a part of the linear portion.

2. The wafer placement table according to claim 1, wherein the first joint has a circular shape that has a diameter d, and the through-hole is a round hole and has a diameter of no less than d/2 and no more than 2d.

3. The wafer placement table according to claim 1,
   wherein the first electrode is a heater electrode or a RF electrode, and
   wherein when the first electrode is the heater electrode, the second electrode is an electrostatic electrode, a RF electrode, or a heater electrode that differs from the first electrode, and when the first electrode is the RF electrode, the second electrode is an electrostatic electrode, a heater electrode, or a RF electrode that differs from the first electrode.

4. The wafer placement table according to claim 1,
   wherein the first electrode is a heater electrode that is formed by using a resistance heating element, and the resistance heating element has a two-dimensional shape and has a thickness of no less than 1 μm and no more than 100 μm.

* * * * *